(12) United States Patent
Iwashita et al.

(10) Patent No.: US 7,582,409 B2
(45) Date of Patent: Sep. 1, 2009

(54) NEGATIVE RESIST COMPOSITION AND METHOD OF FORMING RESIST PATTERN

(75) Inventors: Jun Iwashita, Kawasaki (JP); Ayako Kusaka, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 131 days.

(21) Appl. No.: 11/916,651

(22) PCT Filed: Jun. 16, 2006

(86) PCT No.: PCT/JP2006/312132

§ 371 (c)(1),
(2), (4) Date: Dec. 5, 2007

(87) PCT Pub. No.: WO2006/137340

PCT Pub. Date: Dec. 28, 2006

(65) Prior Publication Data

US 2009/0142698 A1    Jun. 4, 2009

(30) Foreign Application Priority Data

Jun. 20, 2005   (JP) .............................. 2005-179163

(51) Int. Cl.
*G03F 7/004*   (2006.01)
*G03F 7/30*   (2006.01)

(52) U.S. Cl. .................... 430/270.1; 430/325; 430/330; 430/907; 430/910

(58) Field of Classification Search .............. 430/270.1, 430/325, 330, 907, 910
See application file for complete search history.

(56) References Cited

U.S. PATENT DOCUMENTS

| | | | |
|---|---|---|---|
| 5,034,304 | A | 7/1991 | Feely |
| 6,406,829 | B1 * | 6/2002 | Tachikawa et al. ....... 430/270.1 |
| 6,444,397 | B2 | 9/2002 | Hada et al. |
| 2002/0016431 | A1 | 2/2002 | Iwasa et al. |
| 2005/0095532 | A1 * | 5/2005 | Kodama et al. .......... 430/270.1 |
| 2009/0081590 | A1 * | 3/2009 | Shimbori ................. 430/287.1 |

FOREIGN PATENT DOCUMENTS

| | | |
|---|---|---|
| JP | 11-133607 A | 5/1999 |
| JP | 2000-281729 A | 10/2000 |
| JP | 2001-56550 A | 2/2001 |
| JP | 2001-56555 A | 2/2001 |
| JP | 2004-272227 A | 9/2004 |
| JP | 2005-3863 A | 1/2005 |
| JP | 2006-139011 A | 6/2006 |

OTHER PUBLICATIONS

Tsuchiya et al., *Investigation of Acid-Catalyzed Insolubilization Reactions for Alicyclic Polymers with Carboxyl Groups*, Journal of Photopolymer Science and Technology, vol. 10, No. 4, pp. 579-584 (1997).
Maeda et al., *ArF Chemically Amplified Negative Resist Using Aclicyclic Epoxy Polymer*, Journal of Photopolymer Science and Technology, vol. 11, No. 3, pp. 507-512 (1998).
Iwasa et al., *Novel negative photoresist based on polar alicyclic polymers for ArF excimer laser lithography*, SPIE Advances in Resist Technology and Processing XIV, vol. 3333, pp. 417-424 (1998).
Conley et al., *Negative Photoresist for 157 nm Microlithography; A Progress Report*, SPIE Advances in Resist Technology and Processing XIX, vol. 4690, pp. 94-100 (2002).
International Search Report for PCT/JP/2006/312132, dated Jul. 11, 2006.

* cited by examiner

*Primary Examiner*—John S Chu
(74) *Attorney, Agent, or Firm*—Knobbe, Martens, Olson & Bear, LLP

(57) ABSTRACT

A negative resist composition that includes an alkali-soluble resin component, an acid generator component that generates acid upon exposure, and a cross-linker component, wherein the alkali-soluble resin component is a copolymer that includes a structural unit containing an aliphatic cyclic group having a fluorinated hydroxyalkyl group, and a structural unit derived from an acrylate ester that contains a hydroxyl group-containing aliphatic cyclic group, and the cross-linker component includes an alkylene urea-based cross-linker.

6 Claims, 1 Drawing Sheet

NEGATIVE RESIST COMPOSITION AND METHOD OF FORMING RESIST PATTERN

RELATED APPLICATIONS

This application is the U.S. National Phase filing under 35 U.S.C. §371 of PCT/JP2006/312132, filed Jun. 16, 2006, which designated the United States and was published in a language other than English, which claims priority under 35 U.S.C. §119(a)-(d) to Japanese Patent Application No. 2005-179163 filed Jun. 20, 2005. The content of these applications is incorporated herein by reference in their entireties.

TECHNICAL FIELD

The present invention relates to a negative resist composition and a method of forming a resist pattern.

BACKGROUND ART

Lithography techniques include processes in which, for example, a resist film formed from a resist material is formed on top of a substrate, the resist film is selectively irradiated with light or an electron beam or the like through a mask in which a predetermined pattern has been formed, and a developing treatment is then conducted, thereby forming a resist pattern of the prescribed shape in the resist film. Resist materials in which the exposed portions change to become soluble in the developing liquid are term positive materials, whereas resist materials in which the exposed portions change to become insoluble in the developing liquid are termed negative materials.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used. However, recently, mass production of semiconductor elements using KrF excimer lasers and ArF excimer lasers has also commenced. Furthermore, research is also being conducted into radiation with even shorter wavelengths than these excimer lasers, including $F_2$ excimer lasers, electron beams, EUV (extreme ultra violet radiation), and X-rays and the like.

Conventionally, negative resist materials for use in processes that use either i-line radiation or a KrF excimer laser (248 nm) as the light source have employed chemically amplified negative resist compositions containing a combination of an acid generator, an alkali-soluble resin such as a novolak resin or a polyhydroxystyrene, and an amino resin such as a melamine resin or urea resin (for example, see patent reference 1).

Furthermore, negative resist materials that can be applied to processes that use an ArF excimer laser of even shorter wavelength use materials that exhibit improved transparency to ArF excimer lasers. For example, a negative resist composition that includes a resin component containing carboxyl groups, a cross-linker containing alcoholic hydroxyl groups, and an acid generator has been proposed. In this composition, the carboxyl groups within the resin component react with the alcoholic hydroxyl groups of the cross-linker under the action of the acid generated from the acid generator. As a result, the resin component changes from an alkali-soluble state to an alkali-insoluble state.

Furthermore, compositions have also been proposed that include a resin component containing carboxyl groups or carboxylate ester groups as well as alcoholic hydroxyl groups, and an acid generator, wherein an intermolecular reaction between the carboxyl groups or carboxylate ester groups and the alcoholic hydroxyl groups within the resin component, under the action of the acid generated from the acid generator, causes the resin component to change from an alkali-soluble state to an alkali-insoluble state (for example, see non-patent references 1 to 3 and patent reference 2).

DISCLOSURE OF INVENTION

Problems to be Solved by the Invention

However, when resist patterns are formed on substrates using the conventional negative resist compositions described above, resolution problems have tended to arise, including inadequate resolution of portions at the edges of the pattern.

The present invention aims to address the above problems, by providing a negative resist composition and a method of forming a resist pattern that exhibit excellent resolution.

[Patent Reference 1]
Japanese Examined Patent Application, Second Publication No. Hei 08-3635
[Patent Reference 2]
Japanese Unexamined Patent Application, First Publication No. 2000-206694
[Non-Patent Reference 1]
J. Photopolym. Sci. Tech., Vol. 10, No. 4, pages 579 to 584 (1997)
[Non-Patent Reference 2]
J. Photopolym. Sci. Tech., Vol. 11, No. 3, pages 507 to 512 (1998)
[Non-Patent Reference 3]
SPIE Advances in Resist Technology and Processing XIV, Vol. 3333, pages 417 to 424 (1998)
[Non-Patent Reference 4]
SPIE Advances in Resist Technology and Processing XIX, Vol. 4690, pages 94 to 100 (2002)

Means for Solving the Problems

In order to achieve the above object, the present invention includes the aspects described below.

A first aspect of the present invention is a negative resist composition that includes an alkali-soluble resin component (A), an acid generator component (B) that generates acid upon exposure, and a cross-linker component (C), wherein the alkali-soluble resin component (A) is a copolymer (A1) that includes a structural unit (a1) containing an aliphatic cyclic group having a fluorinated hydroxyalkyl group, and a structural unit (a2) derived from an acrylate ester that contains a hydroxyl group-containing aliphatic cyclic group, and the cross-linker component (C) includes an alkylene urea-based cross-linker (C1) represented by a general formula (C1-1) shown below:

[Formula 1]

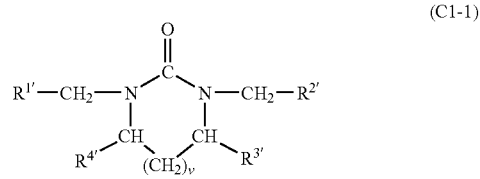

[wherein, $R^{1'}$ and $R^{2'}$ each represent, independently, a hydroxyl group or a lower alkoxy group; $R^{3'}$ and $R^{4'}$ each represent, independently, a hydrogen atom, a hydroxyl group, or a lower alkyl group; and v represents an integer from 0 to 2].

A second aspect of the present invention is a method of forming a resist pattern that includes the steps of forming a resist film on a substrate using a negative resist composition of the first aspect described above, exposing the resist film, and developing the resist film to form a resist pattern.

Within this specification and the scope of the claims, the term "structural unit" refers to a monomer unit that contributes to the formation of a resin component (a polymer).

The term "acrylic acid" is defined as including not only acrylic acid ($CH_2$=CH—COOH) wherein a hydrogen atom is bonded to the α-position carbon atom, but also α-substituted acrylic acids in which the hydrogen atom bonded to the α-position carbon atom has been substituted with a different substituent group, and acrylic acid derivatives such as the acrylate esters described below. Examples of suitable substituent groups include a halogen atom such as a fluorine atom, an alkyl group or a haloalkyl group such as a fluoroalkyl group.

The term "acrylate ester" is defined as including not only the acrylate ester in which a hydrogen atom is bonded to the α-position carbon atom, but also α-substituted acrylate esters in which the hydrogen atom bonded to the α-position carbon atom has been substituted with a different substituent group. Examples of suitable substituent groups include a halogen atom such as a fluorine atom, an alkyl group, or a haloalkyl group such as a fluoroalkyl group.

In an "acrylic acid" or an "acrylate ester", unless stated otherwise, the term "α-position" or "α-position carbon atom" refers to the carbon atom to which the carbonyl group is bonded.

A "structural unit derived from acrylic acid" refers to a structural unit formed by cleavage of the ethylenic double bond of acrylic acid.

A "structural unit derived from an acrylate ester" refers to a structural unit formed by cleavage of the ethylenic double bond of the acrylate ester.

Unless stated otherwise, the term "alkyl group" includes straight-chain, branched-chain and cyclic monovalent saturated hydrocarbon groups.

The term "lower alkyl group" or "lower alkoxy group" refers to an alkyl group or alkoxy group that contains from 1 to 5 carbon atoms.

Furthermore, the term "exposure" is not limited to irradiation with light, but describes a general concept that includes irradiation with any form of radiation, including electron beam irradiation and the like.

EFFECTS OF THE INVENTION

According to the negative resist composition and method of forming a resist pattern of the present invention, a resist pattern with excellent resolution is able to be formed.

BEST MODE FOR CARRYING OUT THE INVENTION

<<Negative Resist Composition>>

Figure 1:
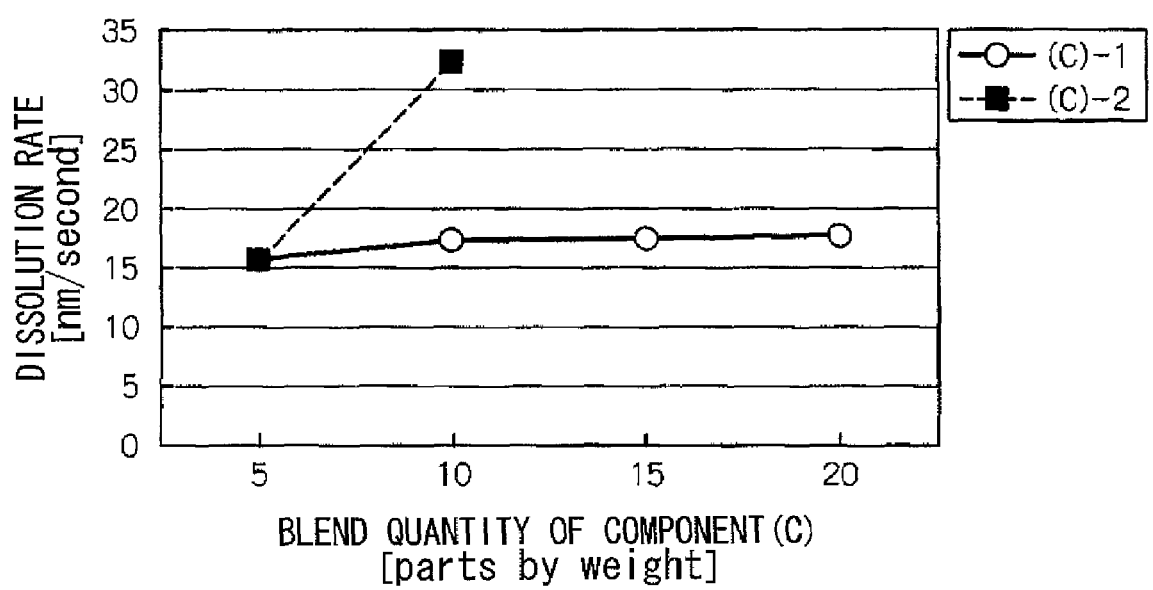
FIG. 1 is a graph showing the results of a test example 1.

A negative resist composition of the present invention includes an alkali-soluble resin component (A) (hereafter abbreviated as the component (A)), an acid generator component (B) that generates acid upon exposure (hereafter abbreviated as the component (B)), and a cross-linker component (C) (hereafter abbreviated as the component (C)).

This negative resist composition is alkali-soluble prior to exposure, but when acid is generated from the component (B) by exposure, a cross-linking occurs between the component (A) and the component (C), causing the composition to become insoluble in alkali. As a result, during formation of a resist pattern, by selectively irradiating the resist film produced by applying the negative resist composition to a substrate, the exposed portions become insoluble in alkali. In contrast, the unexposed portions remain alkali-soluble. Accordingly, a negative resist pattern can be formed by subjecting the resist film to alkali developing.

<Component (A)>

In the present invention, the component (A) is a copolymer (A1) (hereafter also referred to as the component (A1)) that includes a structural unit (a1) containing an aliphatic cyclic group having a fluorinated hydroxyalkyl group (hereafter abbreviated as the structural unit (a1)), and a structural unit (a2) derived from an acrylate ester that contains a hydroxyl group-containing aliphatic cyclic group (hereafter abbreviated as the structural unit (a2)).

Structural Unit (a1)

The structural unit (a1) contains an aliphatic cyclic group having a fluorinated hydroxyalkyl group. By including the structural unit (a1) within the component (A1), swelling of the resist can be suppressed, and a resist pattern with excellent resolution can be formed.

A "fluorinated hydroxyalkyl group" refers to an alkyl group containing a hydroxyl group in which a portion of, or all of, the hydrogen atoms bonded to carbon atoms within the alkyl group have been substituted with fluorine atoms. In such a group, the fluorination increases the ease with which the hydrogen atom of the hydroxyl group is released.

In the fluorinated hydroxyalkyl group, the alkyl group is preferably either a straight-chain or branched-chain alkyl group. Although there are no particular restrictions on the number of carbon atoms within the alkyl group, the number of carbon atoms is preferably from 1 to 20, even more preferably from 4 to 16, and is most preferably from 4 to 12. There are no particular restrictions on the number of hydroxyl groups, although one or two groups is preferred, and a single hydroxyl group is particularly desirable.

Of the various possibilities, groups in which a fluoroalkyl group and/or a fluorine atom is bonded to the carbon atom to which the hydroxyl group is bonded (which refers to the α-position carbon atom of the hydroxyalkyl group) are preferred as the fluorinated hydroxyalkyl group. The fluoroalkyl group bonded to the α-position is preferably a group in which all of the hydrogen atoms of the alkyl group have been substituted with fluorine atoms.

The term "aliphatic" in the expression "aliphatic cyclic group having a fluorinated hydroxyalkyl group" defines a group or compound or the like that contains no aromaticity.

The aliphatic cyclic group may be either monocyclic or polycyclic. The term "monocyclic aliphatic cyclic group" describes a monocyclic group that contains no aromaticity. The term "polycyclic aliphatic cyclic group" describes a polycyclic group that contains no aromaticity. In the structural unit (a1), the aliphatic cyclic group is preferably a polycyclic group.

The aliphatic cyclic group includes both hydrocarbon groups (alicyclic groups) formed solely from carbon and hydrogen, and heterocyclic groups in which a portion of the carbon atoms that constitute the ring structure of the alicyclic group have been substituted with a hetero atom such as an oxygen atom, nitrogen atom, or sulfur atom. The aliphatic cyclic group is preferably an alicyclic group.

The aliphatic cyclic group may be either saturated or unsaturated. A saturated group is preferred, as such groups exhibit superior transparency to ArF excimer lasers and the like, and also exhibit excellent resolution and depth of focus (DOF).

The number of carbon atoms within the aliphatic cyclic group is preferably within a range from 5 to 15.

Specific examples of the aliphatic cyclic group include the groups described below.

Examples of suitable monocyclic groups include groups in which, including the hydrogen atom substituted by the fluorinated hydroxyalkyl group (this also applies below), two or more hydrogen atoms have been removed from a cycloalkane. Specific examples include groups in which two or more hydrogen atoms have been removed from cyclopentane or cyclohexane, and groups in which two hydrogen atoms have been removed from cyclohexane are particularly preferred.

Examples of suitable polycyclic groups include groups in which two or more hydrogen atoms have been removed from a bicycloalkane, tricycloalkane or tetracycloalkane or the like. Specific examples include groups in which two or more hydrogen atoms have been removed from a polycycloalkane such as adamantane, norbornane, isobornane, tricyclodecane or tetracyclododecane.

These types of polycyclic groups can be selected appropriately from the multitude of groups proposed as acid-dissociable, dissolution-inhibiting groups for the resins of positive photoresist compositions used within ArF excimer laser processes.

Of the various possibilities, groups in which two hydrogen atoms have been removed from cyclohexane, adamantane, norbornane or tetracyclododecane are readily available industrially, and are consequently preferred.

Of the monocyclic and polycyclic groups exemplified above, groups in which two hydrogen atoms have been removed from norbornane are particularly desirable.

The structural unit (a1) is preferably a structural unit derived from acrylic acid, and is most preferably a structure in which the aliphatic cyclic group described above is bonded to the oxygen atom (—O—) of the carbonyloxy group [—C(O)O—] of an acrylate ester (namely, a structure in which the hydrogen atom of the carboxyl group of acrylic acid is substituted with the aforementioned aliphatic cyclic group).

Specific examples of preferred forms of the structural unit (a1) include structural units (a11) represented by a general formula (1) shown below.

[Formula 2]

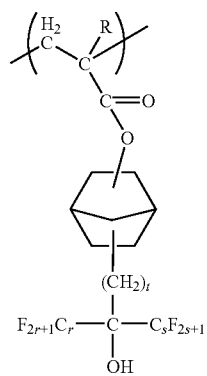

(1)

(wherein, R is a hydrogen atom, an alkyl group, a fluoroalkyl group, or a fluorine atom, and r, s and t each represent, independently, an integer from 1 to 5)

R represents a hydrogen atom, an alkyl group, a fluoroalkyl group, or a fluorine atom.

As the alkyl group represented by R, lower alkyl groups of 1 to 5 carbon atoms are preferred, and specific examples include a methyl group, ethyl group, propyl group, isopropyl group, n-butyl group, isobutyl group, tert-butyl group, pentyl group, isopentyl group, or neopentyl group, although a methyl group is preferred.

The fluoroalkyl group represented by R is preferably a lower alkyl group of 1 to 5 carbon atoms in which one or more of the hydrogen atoms have been substituted with fluorine atoms. Specific examples of suitable alkyl groups include the same groups as those listed above. The hydrogen atoms substituted with fluorine atoms may represent either a portion of, or all of, the hydrogen atoms of the alkyl group.

A hydrogen atom or an alkyl group is preferred as the R group, a hydrogen atom or a methyl group is even more preferred, and a hydrogen atom is the most desirable.

r and s each represent, independently, an integer from 1 to 5, preferably an integer from 1 to 3, and most preferably 1.

t represents an integer from 1 to 5, preferably an integer from 1 to 3, and most preferably 1.

Of the structural units (a11) represented by the general formula (1), a structural unit derived from the monomer α,α'-bis-(trifluoromethyl)-bicyclo[2.2.1]hepta-5-ene-2-ethanol acrylate (in the following examples referred to as a structural unit derived from the monomer NBHFAA) is preferred in terms of the effects achieved, the ease of synthesis, and the superior etching resistance obtained.

The structural unit (a1) may be either a single type of structural unit or a mixture of two or more different structural units.

The proportion of the structural unit (a1) within the copolymer (A1), relative to the combined total of all the structural units that constitute the copolymer (A1), is preferably within a range from 20 to 80 mol %, even more preferably from 30 to 70 mol %, even more preferably from 40 to 65 mol %, and is most preferably from 35 to 55 mol %. Provided the proportion of the structural unit (a1) is within the above numerical range, swelling of the resist can be suppressed, and a more favorable balance can be achieved with the other structural units.

Structural Unit (a2)

The structural unit (a2) is a structural unit derived from an acrylate ester that contains a hydroxyl group-containing aliphatic cyclic group. When a component (A1) containing such a structural unit (a2) is blended into the negative resist composition, the hydroxyl group (alcoholic hydroxyl group) of the structural unit (a2) undergoes a reaction with the component (C) under the action of the acid generated from the component (B). As a result, the component (A1) changes from a state of being soluble in the alkali developing liquid to a state of being insoluble.

The "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those exemplified above in relation to the structural unit (a1).

As the aliphatic cyclic group of the structural unit (a2), of the groups described above, a cyclohexyl group, adamantyl group, norbornyl group or tetracyclododecanyl group are readily available commercially, and are consequently preferred. Of these, a cyclohexyl group or adamantyl group is particularly preferred, and an adamantyl group is the most desirable.

Besides the hydroxyl group, a straight-chain or branched-chain alkyl group of 1 to 4 carbon atoms may also be bonded to the aliphatic cyclic group.

In the structural unit (a2), the hydroxyl group-containing aliphatic cyclic group is preferably bonded to the ester group (—C(O)O—) of the acrylate ester.

In such cases, in the structural unit (a2), another substituent group may be bonded to the α-position (the α-position carbon atom) of the acrylate ester instead of a hydrogen atom. Examples of preferred substituent groups include an alkyl group, a fluoroalkyl group, or a fluorine atom. These groups are as described above in relation to the group R within the general formula (1) of the aforementioned structural unit (a1), and of the various groups that can be bonded to the α-position, a hydrogen atom or an alkyl group is preferred, a hydrogen atom or a methyl group is even more preferred, and a hydrogen atom is the most desirable.

Specific examples of preferred forms of the structural unit (a2) include structural units (a21) represented by a general formula (2) shown below.

[Formula 3]

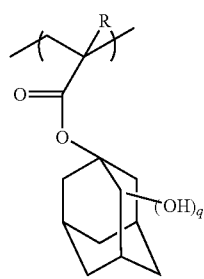

(2)

(wherein, R represents a hydrogen atom, an alkyl group, a fluoroalkyl group, or a fluorine atom, and q represents an integer from 1 to 3)

R represents a hydrogen atom, an alkyl group, a fluoroalkyl group or a fluorine atom that is bonded to the α-position, and is as described above in relation to the general formula (1). In the general formula (2), R is most preferably a hydrogen atom.

Furthermore, q represents an integer from 1 to 3, and is preferably 1.

Although there are no particular restrictions on the bonding position of the hydroxyl group, units in which the hydroxyl group is bonded to position 3 of the adamantyl group are preferred.

The structural unit (a2) may use either a single structural unit, or a mixture of two or more different units.

The proportion of the structural unit (a2) within the copolymer (A1), relative to the combined total of all the structural units that constitute the copolymer (A1), is preferably within a range from 10 to 70 mol %, even more preferably from 10 to 50 mol %, and is most preferably from 20 to 40 mol %. Provided the proportion of the structural unit (a2) is within the above numerical range, the hydroxyl group (alcoholic hydroxyl group) of the structural unit (a2) reacts with the component (C) under the action of the acid generated from the component (B), causing the component (A1) to change from a state of being soluble in the alkali developing liquid to a state of being insoluble, and furthermore, a more favorable balance can be achieved with the other structural units.

Structural Unit (a3)

In addition to the structural unit (a1) and the structural unit (a2), the component (A1) preferably also includes a structural unit (a3) derived from acrylic acid that contains no cyclic structures and contains an alcoholic hydroxyl group as a side chain (hereafter abbreviated as the structural unit (a3)).

When a component (A1) containing the structural unit (a3) is blended into the negative resist composition, the alcoholic hydroxyl group of the structural unit (a3), together with the hydroxyl group of the aforementioned structural unit (a2), undergoes a reaction with the component (C) under the action of the acid generated from the component (B).

As a result, the component (A1) changes more readily from a state of being soluble in the alkali developing liquid to a state of being insoluble, which improves the resolution. Furthermore, thickness loss of the resist film can also be suppressed. Moreover, the controllability of the cross-linking reaction that occurs during pattern formation also improves. The film density also tends to improve. Consequently, the heat resistance tends to improve. In addition, the etching resistance also improves.

The expression "contains no cyclic structures" means the structural unit contains no aliphatic cyclic groups or aromatic groups. The structural unit (a3) is readily distinguishable from the structural unit (a2) as a result of containing no cyclic structures.

Examples of structural units that include an alcoholic hydroxyl group as a side chain include structural units that contain a hydroxyalkyl group.

Examples of this hydroxyalkyl group include the same hydroxyalkyl groups as those within the "fluorinated hydroxyalkyl group" described above in relation to the structural unit (a1).

The hydroxyalkyl group may be bonded directly to the α-position carbon atom of the principal chain (the portion formed by cleavage of the ethylenic double bond of acrylic acid), or may form an ester group through substitution of the hydrogen atom of the acrylic acid carboxyl group. In the structural unit (a3), the hydroxyalkyl group preferably exists at either one, or both of these locations.

In those cases where the hydroxyalkyl group is not bonded to the α-position, the hydrogen atom at the α-position carbon atom may be replaced with an alkyl group, a fluoroalkyl group, or a fluorine atom. These groups are as described above in relation to the group R within the general formula (1).

As the structural unit (a3), structural units (a31) represented by a general formula (3) shown below are particularly preferred, as they yield superior effects for the present invention.

[Formula 4]

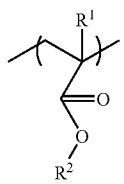

(3)

(wherein, $R^1$ represents a hydrogen atom, an alkyl group, a fluoroalkyl group, a fluorine atom or a hydroxyalkyl group, and $R^2$ represents a hydrogen atom, an alkyl group, or a hydroxyalkyl group, provided that at least one of $R^1$ and $R^2$ represents a hydroxyalkyl group)

A hydroxyalkyl group represented by $R^1$ is preferably a hydroxyalkyl group of 1 to 10 carbon atoms, is preferably a straight-chain or branched-chain group, is even more preferably a hydroxyalkyl group of 2 to 8 carbon atoms, and is most preferably a hydroxymethyl group or hydroxyethyl group. There are no particular restrictions on the number of hydroxyl groups or the bonding positions of those groups, although one hydroxyl group is typical, and the hydroxyl group is preferably bonded to the terminal of the alkyl group.

An alkyl group represented by $R^1$ is preferably an alkyl group of 1 to 10 carbon atoms, even more preferably an alkyl group of 2 to 8 carbon atoms, and is most preferably an ethyl group or methyl group.

A fluoroalkyl group represented by $R^1$ is preferably a lower alkyl group of 1 to 5 carbon atoms (most preferably an ethyl group or methyl group) in which a portion of, or all of, the hydrogen atoms have been substituted with fluorine atoms.

For the group $R^2$, suitable alkyl groups and hydroxyalkyl groups are the same as the alkyl groups and hydroxyalkyl groups described for $R^1$.

Specific examples of suitable structural units represented by the general formula (3) include structural units derived from α-(hydroxyalkyl)acrylic acids (not including structural units derived from acrylate esters), structural units derived from alkyl α-(hydroxyalkyl)acrylate esters, and structural units derived from hydroxyalkyl (α-alkyl)acrylate esters.

Of these, including a structural unit derived from an alkyl α-(hydroxyalkyl)acrylate ester as the structural unit (a3) is preferred in terms of improving the effects of the present invention and the resist film density, and of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a3) is preferred in terms of improving the cross-linking efficiency. Of such units, structural units derived from hydroxyethyl α-methyl-acrylate or hydroxymethyl α-methyl-acrylate are particularly desirable.

The structural unit (a3) may use either a single structural unit, or a mixture of two or more different units.

The proportion of the structural unit (a3) within the copolymer (A1), relative to the combined total of all the structural units that constitute the copolymer (A1), is preferably within a range from 10 to 70 mol %, even more preferably from 10 to 40 mol %, and is most preferably from 10 to 25 mol %. Provided the proportion of the structural unit (a3) is within the above numerical range, the alcoholic hydroxyl group of the structural unit (a3), together with the hydroxyl group of the aforementioned structural unit (a2), undergoes a reaction with the component (C) under the action of the acid generated from the component (B). Consequently, the component (A1) changes from a state of being soluble in the alkali developing liquid to a state of being insoluble.

As a result, the component (A1) changes more readily from a state of being soluble in the alkali developing liquid to a state of being insoluble, the resolution improves, thickness loss of the resist film can be suppressed, the controllability of the cross-linking reaction that occurs during pattern formation improves, the film density, heat resistance and etching resistance also improve, and a more favorable balance can be achieved with the other structural units.

Other Structural Units

In addition to the structural units (a1) to (a3) described above, the component (A1) may also include other copolymerizable structural units.

Examples of such structural units include any of the structural units used in known resin components of conventional chemically amplified resist compositions. A specific example is a structural unit (a4) derived from an acrylate ester that includes a lactone-containing monocyclic or polycyclic group.

When used in forming a resist film, the lactone-containing monocyclic or polycyclic group of the structural unit (a4) is effective in improving the adhesion of the resist film to the substrate, and enhancing the hydrophilicity relative to the developing liquid. Furthermore, the structural unit (a4) also improves the swelling suppression effect.

In this description, the term "lactone" refers to a single ring containing a —O—C(O)— structure, and this lactone ring is counted as the first ring. Accordingly, groups that contain only the lactone ring are referred to as monocyclic groups, whereas groups that also contain other ring structures are described as polycyclic groups regardless of the structure of the other rings.

Structural units in which one or more of the hydrogen atoms of the lactone-containing monocyclic or polycyclic group have been substituted with a fluorinated hydroxyalkyl group are not included within the definition of the structural unit (a4).

As the structural unit (a4), any unit can be used without any particular restrictions, provided it includes a lactone ring that contains both the above type of ester structure (—O—C(O)—) and a cyclic structure.

Specifically, examples of lactone-containing monocyclic groups include groups in which one hydrogen atom has been removed from γ-butyrolactone. Examples of lactone-containing polycyclic groups include groups in which one hydrogen atom has been removed from a lactone ring-containing bicycloalkane, tricycloalkane, or tetracycloalkane.

Groups obtained by removing one hydrogen atom from a lactone-containing tricycloalkane with a structural formula such as that shown below are particularly preferred in terms of industrial availability.

[Formula 5]

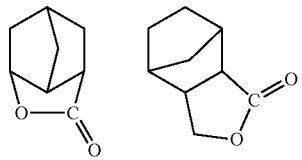

Furthermore, in the structural unit (a4), a lactone-containing polycyclic group is preferred, and structural units containing a norbornane lactone are particularly preferred.

In the structural unit (a4), another substituent group may be bonded to the α-position (the α-position carbon atom) instead of a hydrogen atom. Examples of preferred substituent groups include an alkyl group, fluoroalkyl group, or fluorine atom.

These groups are as described above in relation to the group R within the general formula (1) of the aforementioned structural unit (a1), and of the various groups that can be bonded to the α-position, a hydrogen atom or an alkyl group is preferred, a hydrogen atom or a methyl group is even more preferred, and a hydrogen atom is the most desirable.

More specific examples of the structural unit (a4) include the structural units represented by general formulas (a4-1) to (a4-5) shown below.

[Formula 6]

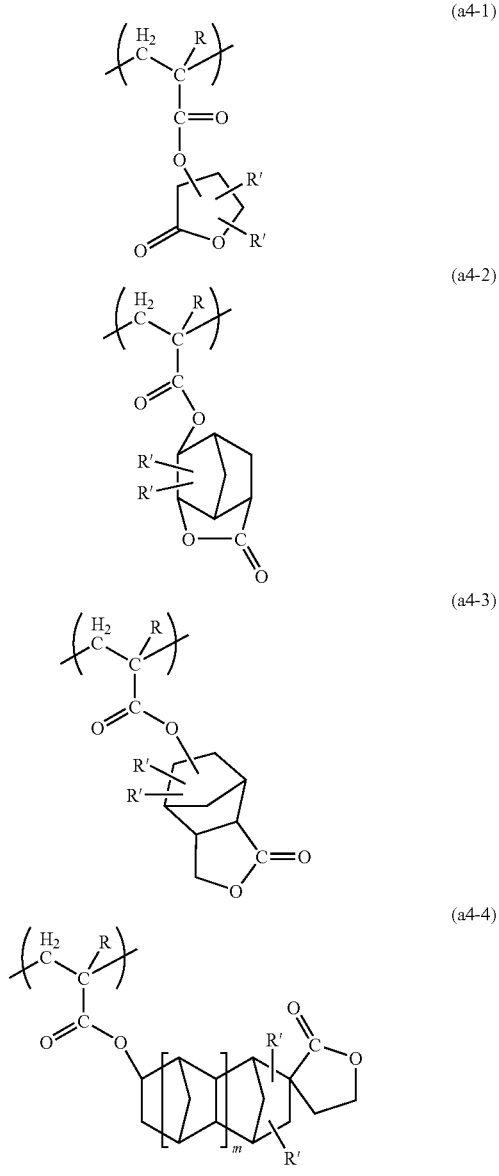

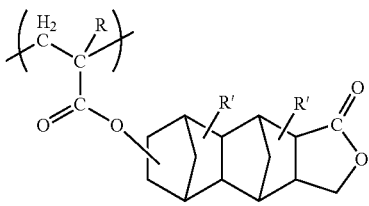

(wherein, R is as defined above, each R' represents, independently, a hydrogen atom, an alkyl group, or an alkoxy group of 1 to 5 carbon atoms, and m represents an integer of either 0 or 1)

Examples of the alkyl group of R' within the general formulas (a4-1) to (a4-5) include the same alkyl groups as those described in relation to the group R in the structural unit (a1). In the general formulas (a4-1) to (a4-5), from the viewpoint of factors such as industrial availability, R' is most preferably a hydrogen atom.

The structural unit (a4) is most preferably a structural unit represented by one of the general formulas (a4-2) to (a4-3).

The structural unit (a4) may use either a single structural unit, or a mixture of two or more different units.

The structural unit (a4) is not an essential component. In those cases where a structural unit (a4) is included, the proportion of the structural unit (a4) within the copolymer (A1), relative to the combined total of all the structural units that constitute the copolymer (A1), is preferably within a range from 10 to 70 mol %, even more preferably from 10 to 40 mol %, and is most preferably from 10 to 25 mol %. Provided the proportion of the structural unit (a4) is within the above numerical range, the adhesion of the resist film to the substrate is enhanced, the hydrophilicity relative to the developing liquid is improved, a swelling suppression effect is achieved, and a more favorable balance can be achieved with the other structural units.

In the present invention, the component (A1) is preferably a copolymer containing all of the structural units (a1) to (a3), and is most preferably a copolymer in which the structural units (a1) to (a3) represent the primary components.

Here, the term "primary components" means that the combined total of the structural units (a1) to (a3) accounts for at least 50 mol % of all the structural units, and the combination of these structural units preferably accounts for at least 70 mol %, and even more preferably 80 mol % or greater, of all the structural units. Copolymers in which these structural units account for 100 mol % are the most desirable. The copolymer (A1) is most preferably a copolymer formed solely from the structural unit (a1), the structural unit (a2) and the structural unit (a3).

In those cases where the component (A1) is a copolymer that contains the structural unit (a1), the structural unit (a2) and the structural unit (a3), and is preferably a copolymer formed solely from these structural units, the respective proportions of each structural unit relative to the combined total of all the structural units that constitute the component (A1), preferably satisfy the numerical ranges described below.

The proportion of the structural unit (a1) is preferably within a range from 20 to 80 mol %, even more preferably from 30 to 70 mol %, even more preferably from 40 to 65 mol %, and is most preferably from 35 to 55 mol %.

The proportion of the structural unit (a2) is preferably within a range from 10 to 70 mol %, even more preferably from 10 to 50 mol %, and is most preferably from 20 to 40 mol %.

The proportion of the structural unit (a3) is preferably within a range from 10 to 70 mol %, even more preferably from 10 to 40 mol %, and is most preferably from 10 to 25 mol %.

Ensuring that the proportions satisfy these ranges enables an improvement in the swelling suppression effect, and an improvement in the effects of the present invention. In particular, by ensuring a favorable balance between the structural unit (a2) and the structural unit (a3), an appropriate resist pattern contrast can be obtained, resulting in an improvement in the resolution. Furthermore, the etching resistance also improves.

Moreover, a favorable exposure margin can also be achieved.

The weight average molecular weight (Mw: the polystyrene equivalent weight average molecular weight determined using gel permeation chromatography (GPC)) of the component (A1) is preferably within a range from 2,000 to 30,000, even more preferably from 2,000 to 10,000, and is most preferably from 3,000 to 8,000. Ensuring a molecular weight within this range is preferred in terms of ensuring a favorable rate of dissolution of the resist composition of the present invention in the alkali developing liquid, and achieving a high level of resolution. Within the above range, lower molecular weight values tend to result in more favorable properties.

Furthermore, the degree of dispersion (Mw/number average molecular weight (Mn)) is typically within a range from 1.0 to 5.0, and is preferably from 1.0 to 2.5.

The component (A1) can be obtained, for example, by a conventional radical polymerization of the monomers that yield each of the structural units.

The component (A) may use either a single component (A1), or a mixture of two or more different components.

In addition to the component (A1), other known polymer compounds for use within negative resist compositions such as hydroxystyrene resins, novolak resins and acrylic resins may also be included within the component (A).

However, the proportion of the component (A1) within the component (A) is preferably at least 50% by weight, even more preferably 70% by weight or greater, even more preferably 80% by weight or greater, and is most preferably 100% by weight.

<Component (B)>

There are no particular restrictions on the component (B), and any of the known acid generators used within conventional chemically amplified resists can be used. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of suitable onium salt-based acid generators include the acid generators represented by a general formula (b-0) shown below.

[Formula 7]

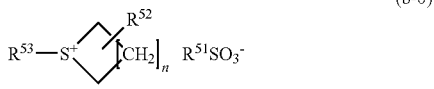

(b-0)

[wherein, $R^{51}$ represents a straight-chain, branched-chain or cyclic alkyl group, or a straight-chain, branched-chain or cyclic fluoroalkyl group; $R^{52}$ represents a hydrogen atom, a hydroxyl group, a halogen atom, a straight-chain or branched-chain alkyl group, a straight-chain or branched-chain haloalkyl group, or a straight-chain or branched-chain alkoxy group; $R^{53}$ represents an aryl group that may contain a substituent group; and n represents an integer from 1 to 3]

In the general formula (b-0), $R^{51}$ represents a straight-chain, branched-chain or cyclic alkyl group, or a straight-chain, branched-chain or cyclic fluoroalkyl group.

The straight-chain or branched-chain alkyl group preferably contains from 1 to 10 carbon atoms, even more from preferably 1 to 8 carbon atoms, and most preferably from 1 to 4 carbon atoms.

The cyclic alkyl group preferably contains from 4 to 12 carbon atoms, even more preferably from 5 to 10 carbon atoms, and most preferably from 6 to 10 carbon atoms.

The fluoroalkyl group preferably contains from 1 to 10 carbon atoms, even more preferably from 1 to 8 carbon atoms, and most preferably from 1 to 4 carbon atoms. Furthermore, the fluorination ratio (the ratio of the number of substituted fluorine atoms relative to the total number of hydrogen atoms within the alkyl group) is preferably within a range from 10 to 100%, and even more preferably from 50 to 100%, and groups in which all of the hydrogen atoms have been substituted with fluorine atoms yield the strongest acids, and are consequently the most desirable.

As the group $R^{51}$, a straight-chain alkyl group or fluoroalkyl group is the most desirable.

$R^{52}$ represents a hydrogen atom, a hydroxyl group, a halogen atom, a straight-chain, branched-chain or cyclic alkyl group, a straight-chain or branched-chain haloalkyl group, or a straight-chain or branched-chain alkoxy group.

Examples of the halogen atom represented by $R^{52}$ include a fluorine atom, bromine atom, chlorine atom or iodine atom, and a fluorine atom is preferred.

Examples of the alkyl group represented by $R^{52}$ include straight-chain and branched-chain groups in which the number of carbon atoms is preferably within a range from 1 to 5, even more preferably from 1 to 4, and most preferably from 1 to 3.

Examples of haloalkyl groups represented by $R^{52}$ include groups in which either a portion of, or all of, the hydrogen atoms within the alkyl group have been substituted with halogen atoms. Here, an alkyl group refers to the same type of group as the "alkyl group" described above for the group $R^{52}$. Examples of the substituent halogen atom include the same halogen atoms as those described above in relation to "halogen atoms". In the haloalkyl group, 50 to 100% of the total number of hydrogen atoms are preferably substituted with halogen atoms, and groups in which all of the hydrogen atoms have been substituted are particularly desirable.

Examples of the alkoxy group represented by $R^{52}$ include straight-chain and branched-chain groups in which the number of carbon atoms is preferably within a range from 1 to 5, even more preferably from 1 to 4, and most preferably from 1 to 3.

Of the groups described above, $R^{52}$ is most preferably a hydrogen atom.

$R^{53}$ represents an aryl group that may contain a substituent group, and examples of the basic ring structure excluding any substituent groups (the matrix structure) include a naphthyl group, phenyl group or anthracenyl group, and from the viewpoints of maximizing the effects of the present invention and ensuring favorable absorption of the exposure light such as the ArF excimer laser light, a phenyl group is preferred.

Examples of the substituent group include a hydroxyl group or a lower alkyl group (which may be a straight-chain or branched-chain group, preferably contains from 1 to 5 carbon atoms, and is most preferably methyl group).

The aryl group represented by $R^{53}$ preferably contains no substituent groups.

n represents an integer from 1 to 3, is preferably either 2 or 3, and is most preferably 3.

Examples of preferred acid generators represented by the general formula (b-0) include the compounds shown below.

[Formula 8]

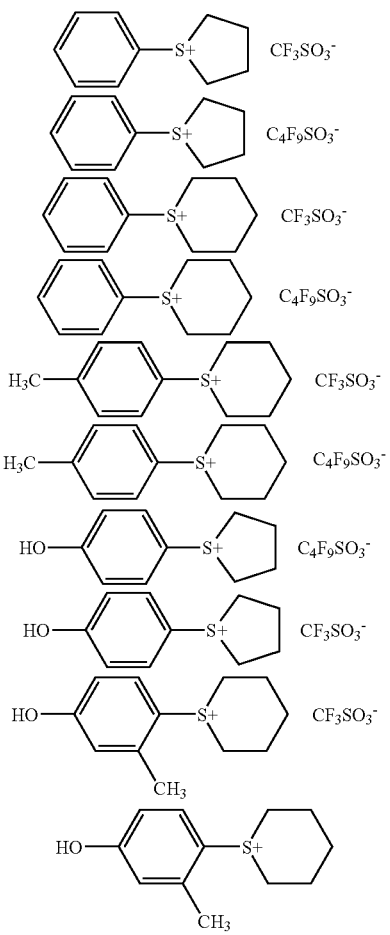

Of these compounds, the compound represented by the chemical formula (b-0-1) shown below is particularly desirable.

[Formula 9]

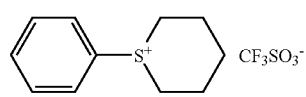

(b-0-1)

The acid generator represented by the general formula (b-0) may use either a single compound, or a mixture of two or more different compounds.

Furthermore, examples of onium salt-based acid generators besides those represented by the above general formula (b-0) include compounds represented by general formulas (b-1) and (b-2) shown below.

[Formula 10]

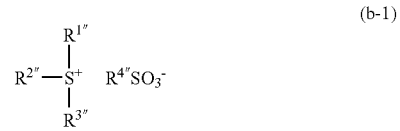

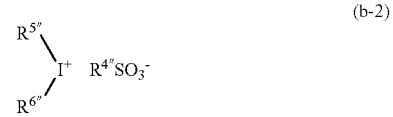

[wherein, $R^{1''}$ to $R^{3''}$, and $R^{5''}$ to $R^{6''}$ each represent, independently, an aryl group or an alkyl group; and $R^{4''}$ represents a straight-chain, branched or cyclic alkyl group or fluoroalkyl group; provided that at least one of $R^{1''}$ to $R^{3''}$ represents an aryl group, and at least one of $R^{5''}$ to $R^{6''}$ represents an aryl group]

In the formula (b-1), $R^{1''}$ to $R^{3''}$ each represent, independently, an aryl group or an alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group is the most desirable.

Alkoxy groups that may be used for substitution of the hydrogen atoms of the above aryl groups are preferably alkoxy groups of 1 to 5 carbon atoms, and a methoxy group or ethoxy group is the most desirable.

Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group. Of these, in terms of achieving superior resolution and enabling low-cost synthesis, a methyl group is the most desirable.

Of the above possibilities, compounds in which $R^{1''}$ to $R^{3''}$ are all phenyl groups are the most preferred.

The group $R^{4''}$ represents a straight-chain, branched or cyclic alkyl group or fluoroalkyl group. The straight-chain or branched alkyl group preferably contains from 1 to 10 carbon atoms, even more preferably from 1 to 8 carbon atoms, and most preferably from 1 to 4 carbon atoms.

Suitable cyclic alkyl groups include the same groups as those listed above in relation to the group $R^{1''}$, and cyclic groups of 4 to 15 carbon atoms are preferred, groups of 4 to 10 carbon atoms are even more preferred, and groups of 6 to 10 carbon atoms are the most desirable.

As the above fluoroalkyl group, groups of 1 to 10 carbon atoms are preferred, groups of 1 to 8 carbon atoms are even more preferred, and groups of 1 to 4 carbon atoms are the most desirable. Furthermore, the fluorination ratio of the fluoroalkyl group (namely, the fluorine atom proportion within the alkyl group) is preferably within a range from 10 to 100%, and even more preferably from 50 to 100%, and groups in which all of the hydrogen atoms have been substituted with fluorine atoms yield the strongest acids, and are consequently the most desirable.

The group $R^{4''}$ is most preferably a straight-chain or cyclic alkyl group, or a fluoroalkyl group.

In the formula (b-2), $R^{5''}$ to $R^{6''}$ each represent, independently, an aryl group or an alkyl group. At least one of $R^{5''}$ to $R^{6''}$ represents an aryl group. Compounds in which all of $R^{5''}$ to $R^{6''}$ are aryl groups are the most preferred.

Suitable examples of the aryl groups of the groups $R^{5''}$ to $R^{6''}$ include the same aryl groups as those described above for the groups $R^{1''}$ to $R^{3''}$.

Suitable examples of the alkyl groups of the groups $R^{5''}$ to $R^{6''}$ include the same alkyl groups as those described above for the groups $R^{1''}$ to $R^{3''}$.

Of the above possibilities, compounds in which $R^{5''}$ to $R^{6''}$ are all phenyl groups are the most preferred.

Suitable examples of the group $R^{4''}$ in the formula (b-2) include the same groups as those described for the group $R^{4''}$ in the aforementioned formula (b-1).

Specific examples of suitable onium salt-based acid generators represented by the general formula (b-1) or (b-2) include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. Furthermore, onium salts in which the anion portion of the above onium salts have been substituted with methanesulfonate, n-propanesulfonate, n-butanesulfonate, or n-octanesulfonate can also be used.

Furthermore, onium salt-based acid generators in which the anion portion within the above general formulas (b-1) and (b-2) has been substituted with an anion portion represented by a general formula (b-3) or (b-4) shown below (and in which the cation portion is the same as that shown in (b-1) or (b-2)) can also be used.

[Formula 11]

[wherein, X" represents an alkylene group of 2 to 6 carbon atoms in which at least one hydrogen atom has been substituted with a fluorine atom; Y" and Z", each represent, independently, an alkyl group of 1 to 10 carbon atoms in which at least one hydrogen atom has been substituted with a fluorine atom]

The group X" is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y" and Z" each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" are preferred for reasons including better solubility within the resist solvent.

Furthermore, in the alkylene group X" or the alkyl groups Y" and Z", the larger the number of hydrogen atoms that have been substituted with fluorine atoms, the stronger the acid becomes, and the transparency relative to high energy light beams with a wavelength of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

In the present invention, the term "oxime sulfonate-based acid generator" describes a compound that contains at least one group represented by a general formula (B-1) shown below, and generates acid upon irradiation. These types of oxime sulfonate-based acid generators are widely used within chemically amplified resist compositions, and any of these conventional compounds can be used.

[Formula 12]

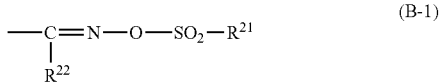

(In the formula (B-1), $R^{21}$ and $R^{22}$ each represent, independently, an organic group.)

In the present invention, the above organic groups preferably include carbon atoms, and may also include atoms other than carbon atoms (such as hydrogen atoms, oxygen atoms, nitrogen atoms, sulfur atoms, and halogen atoms (such as fluorine atoms or chlorine atoms)).

The organic group of $R^{21}$ is preferably a straight-chain, branched or cyclic alkyl group or aryl group. These alkyl groups or aryl groups may also include a substituent group. There are no particular restrictions on such substituent groups, and suitable examples include a fluorine atom or a straight-chain, branched or cyclic alkyl group of 1 to 6 carbon atoms. Here, the expression "include a substituent group" means that either a portion of, or all of, the hydrogen atoms of the alkyl group or aryl group are substituted with substituent groups.

The alkyl group preferably contains from 1 to 20 carbon atoms, even more preferably from 1 to 10 carbon atoms, even more preferably from 1 to 8 carbon atoms, even more preferably from 1 to 6 carbon atoms, and most preferably from 1 to 4 carbon atoms. Furthermore, alkyl groups that are partially or completely halogenated (hereafter also referred to as haloalkyl groups) are preferred. A partially halogenated alkyl group is an alkyl group in which a portion of the hydrogen atoms have been substituted with halogen atoms, whereas a completely halogenated alkyl group is an alkyl group in which all of the hydrogen atoms have been substituted with halogen atoms. Examples of the halogen atoms include fluorine atoms, chlorine atoms, bromine atoms or iodine atoms, although fluorine atoms are particularly desirable. In other words, the haloalkyl group is preferably a fluoroalkyl group.

The aryl group preferably contains from 4 to 20 carbon atoms, even more preferably from 4 to 10 carbon atoms, and most preferably from 6 to 10 carbon atoms. Aryl groups that are partially or completely halogenated are preferred. A partially halogenated aryl group is an aryl group in which a portion of the hydrogen atoms have been substituted with halogen atoms, whereas a completely halogenated aryl group is an aryl group in which all of the hydrogen atoms have been substituted with halogen atoms.

As the group $R^{21}$, an alkyl group of 1 to 4 carbon atoms containing no substituent groups, or a fluoroalkyl group of 1 to 4 carbon atoms is the most desirable.

The organic group of $R^{22}$ is preferably a straight-chain, branched or cyclic alkyl group or aryl group, or a cyano group. Examples of suitable alkyl groups and aryl groups for $R^{22}$ include the same alkyl groups and aryl groups described above in relation to $R^{21}$.

As the group $R^{22}$, a cyano group, an alkyl group of 1 to 8 carbon atoms containing no substituent groups, or a fluoroalkyl group of 1 to 8 carbon atoms is the most desirable.

Particularly preferred oxime sulfonate-based acid generators include the compounds represented by the general formulas (B-2) and (B-3) shown below.

[Formula 13]

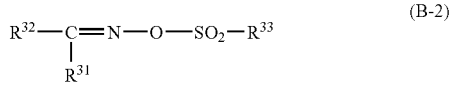

(B-2)

[In the formula (B-2), $R^{31}$ represents a cyano group, an alkyl group containing no substituent groups, or a haloalkyl group. $R^{32}$ represents an aryl group. $R^{33}$ represents an alkyl group containing no substituent groups, or a haloalkyl group.]

[Formula 14]

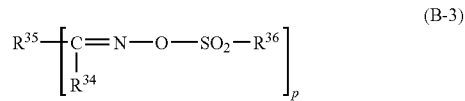

(B-3)

[In the formula (B-3), $R^{34}$ represents a cyano group, an alkyl group containing no substituent groups, or a haloalkyl group. $R^{35}$ represents a bivalent or trivalent aromatic hydrocarbon group. $R^{36}$ represents an alkyl group containing no substituent groups, or a haloalkyl group. p is either 2 or 3.]

In the above general formula (B-2), the alkyl group containing no substituent groups or haloalkyl group represented by $R^{31}$ preferably contains from 1 to 10 carbon atoms, even more preferably from 1 to 8 carbon atoms, and most preferably from 1 to 6 carbon atoms.

The group $R^{31}$ is preferably a haloalkyl group, and even more preferably a fluoroalkyl group.

In the fluoroalkyl group of $R^{31}$, at least 50% of the hydrogen atoms of the alkyl group are preferably fluorinated, and this ratio is even more preferably 70% or higher, and is most preferably 90% or higher.

The aryl group represented by $R^{32}$ is preferably a group in which one hydrogen atom has been removed from an aromatic hydrocarbon ring, such as a phenyl group, biphenyl group, fluorenyl group, naphthyl group, anthracyl group or phenanthryl group, or a heteroaryl group in which a portion of the carbon atoms that constitute the ring structure within the above groups have been substituted with a hetero atom such as an oxygen atom, sulfur atom or nitrogen atom. Of these possibilities, a fluorenyl group is particularly preferred.

The aryl group of $R^{32}$ may include a substituent group such as an alkyl group, haloalkyl group or alkoxy group of 1 to 10 carbon atoms. The alkyl group or haloalkyl group substituent groups preferably contain from 1 to 8 carbon atoms, and even more preferably from 1 to 4 carbon atoms. Furthermore, the haloalkyl group is preferably a fluoroalkyl group.

The alkyl group containing no substituent groups or haloalkyl group represented by $R^{33}$ preferably contains from 1 to 10 carbon atoms, even more preferably from 1 to 8 carbon atoms, and most preferably from 1 to 6 carbon atoms.

The group $R^{33}$ is preferably a haloalkyl group, even more preferably a fluoroalkyl group, and is most preferably a partially fluorinated alkyl group.

In the fluoroalkyl group of $R^{33}$, at least 50% of the hydrogen atoms of the alkyl group are preferably fluorinated, and groups in which 70% or more, and even more preferably 90% or more, of the hydrogen atoms are fluorinated are particularly desirable as they increase the strength of the acid that is generated. Completely fluorinated alkyl groups in which 100% of the hydrogen atom have been substituted with fluorine atoms are the most desirable.

In the above general formula (B-3), examples of the alkyl group containing no substituent groups or haloalkyl group represented by $R^{34}$ include the same alkyl groups containing no substituent groups and haloalkyl groups described above for the group $R^{31}$.

Examples of the bivalent or trivalent aromatic hydrocarbon group represented by $R^{35}$ include groups in which a further one or two hydrogen atoms respectively are removed from an aryl group of the aforementioned group $R^{32}$.

Examples of the alkyl group containing no substituent groups or haloalkyl group represented by $R^{36}$ include the same alkyl groups containing no substituent groups and haloalkyl groups described above for the group $R^{33}$.

p is preferably 2.

Specific examples of suitable oxime sulfonate-based acid generators include α-(p-toluenesulfonyloxyimino)-benzyl cyanide, α-(p-chlorobenzenesulfonytoxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Furthermore, further examples include the compounds represented by the chemical formulas shown below.

[Formula 15]

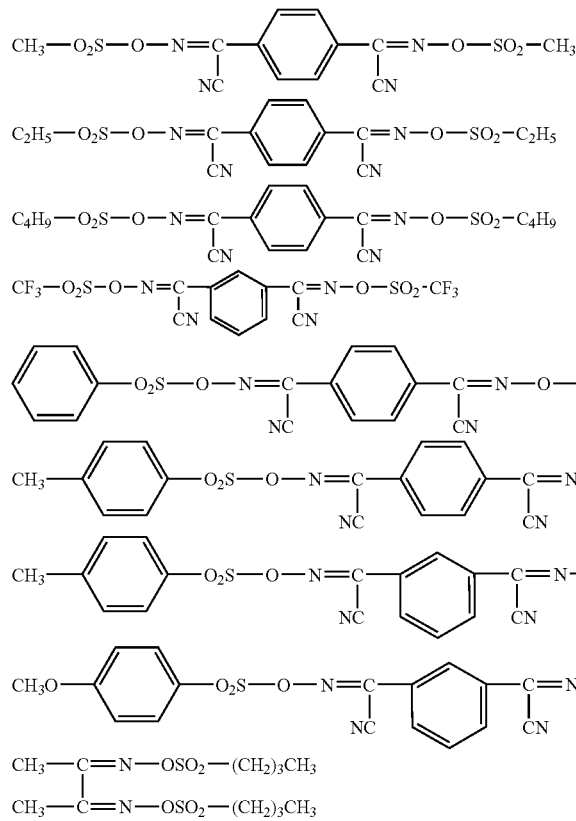
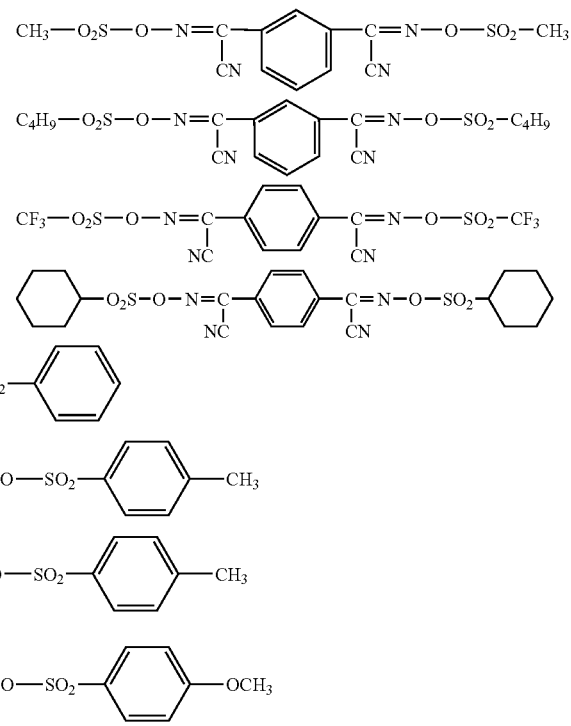

Furthermore, of the compounds represented by the aforementioned general formulas (B-2) and (B-3), examples of particularly preferred compounds include those shown below.

[Formula 16]

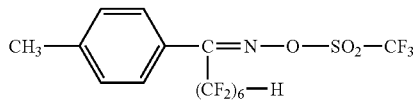

-continued
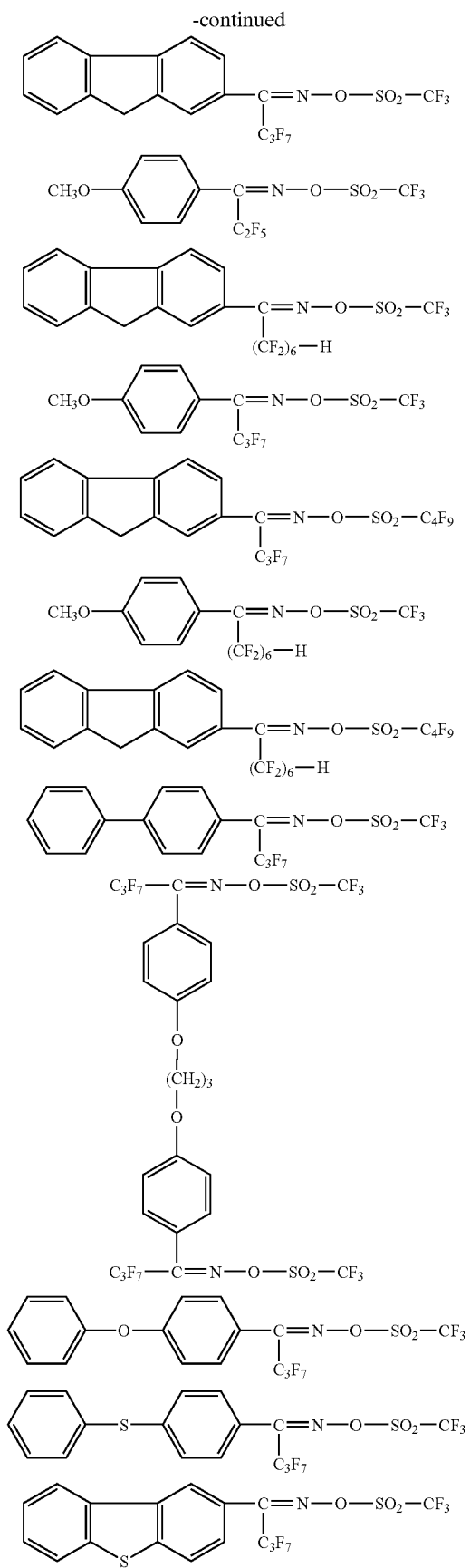
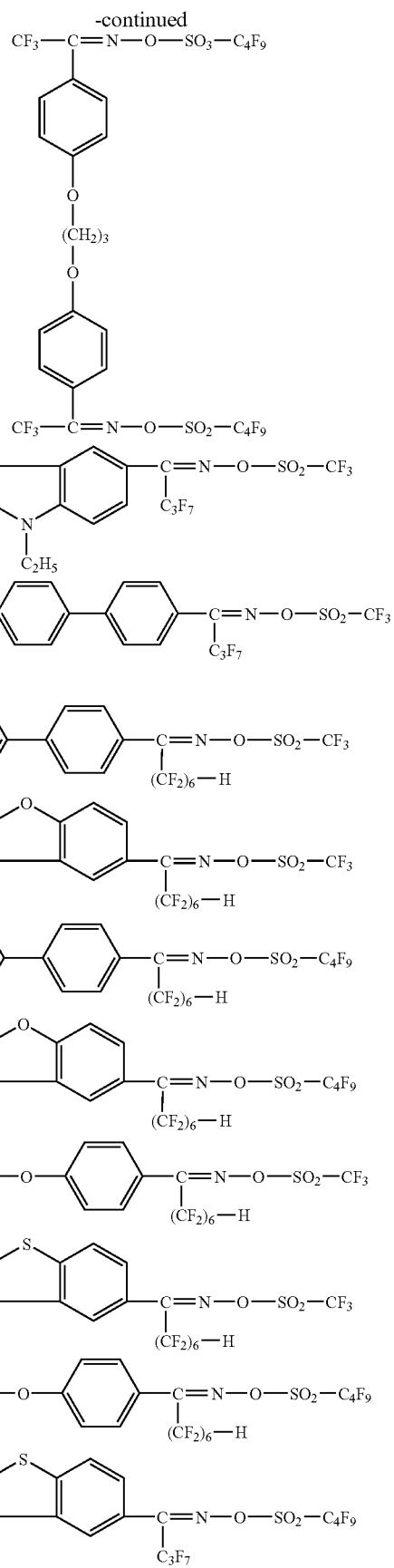

-continued

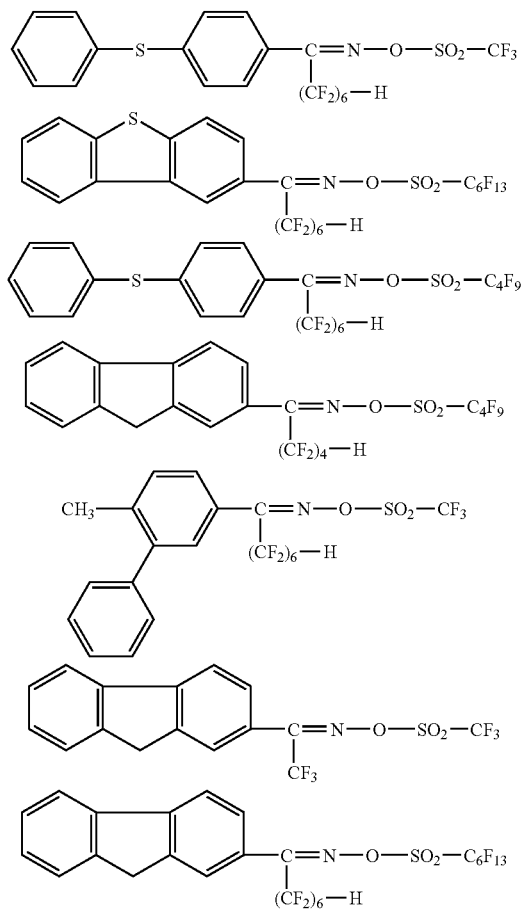

Of the above compounds, the four compounds shown below are particularly desirable.

[Formula 18]

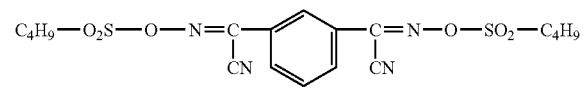

[Formula 19]

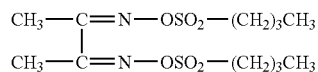

[Formula 20]

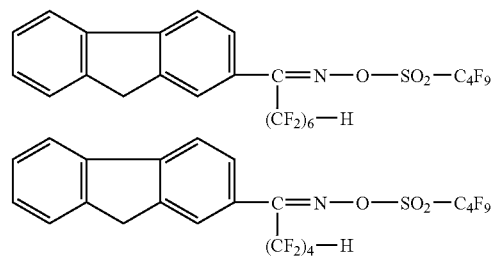

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (wherein A=3), 1,4-bis(phenylsulfonyldiazomethylsulfonyl)butane (wherein A=4), 1,6-bis(phenylsulfonyldiazomethylsulfonyl)hexane (wherein A=6), 1,10-bis(phenylsulfonyldiazomethylsulfonyl)decane (wherein A=10), 1,2-bis(cyclohexylsulfonyldiazomethylsulfonyl)ethane (wherein B=2), 1,3-bis(cyclohexylsulfonyldiazomethylsulfonyl)propane (wherein B-3), 1,6-bis(cyclohexylsulfonyldiazomethylsulfonyl)hexane (wherein B=6), and 1,10-bis(cyclohexylsulfonyldiazomethylsulfonyl)decane (wherein B=10).

[Formula 21]

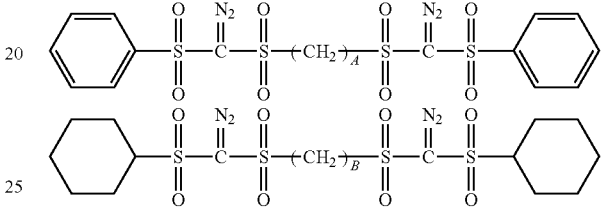

In the present invention, as the component (B), the use of an onium salt having a fluorinated alkylsulfonate ion as the anion is preferred, and of such salts, sulfonium salts are particularly desirable.

Furthermore, the cation portion preferably includes at least one group, and even more preferably three groups, selected from amongst phenyl groups that may be substituted with a straight-chain or branched-chain lower alkyl group of 1 to 5 carbon atoms or a straight-chain or branched-chain lower alkoxy group of 1 to 5 carbon atoms, and naphthyl groups that may be substituted with the same substituent groups.

Of these possibilities, triphenylsulfonium trifluoromethanesulfonate is particularly preferred.

The component (B) may use either a single acid generator or a combination of two or more different acid generators.

The quantity of the component (B) within the negative resist composition of the present invention is preferably within a range from 0.5 to 30 parts by weight, and even more preferably from 1 to 10 parts by weight, per 100 parts by weight of the component (A). Ensuring a quantity within this range enables satisfactory pattern formation to be conducted. Furthermore, a uniform solution is obtained, and the storage stability is also favorable, both of which are desirable.

<Component (C)>

In order to ensure the favorable effects of the present invention, the component (C) must include an alkylene urea-based cross-linker (C1) (hereafter abbreviated as the component (C1)) represented by the general formula (C1-1) shown below:

[Formula 22]

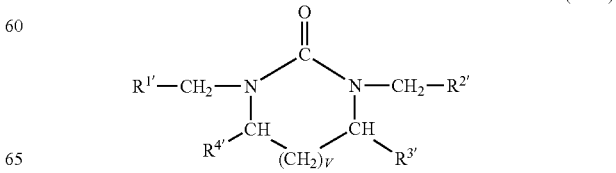

[wherein, $R^{1'}$ and $R^{2'}$ each represent, independently, a hydroxyl group or a lower alkoxy group; $R^{3'}$ and $R^{4'}$ each represent, independently, a hydrogen atom, a hydroxyl group, or a lower alkyl group; and v represents an integer from 0 to 2].

The lower alkoxy group of $R^{1'}$ and $R^{2'}$ may be either a straight-chain or branched group, and is preferably an alkoxy group of 1 to 4 carbon atoms. Examples of suitable lower alkoxy groups include a methoxy group, ethoxy group, propoxy group or butoxy group.

The groups $R^{1'}$ and $R^{2'}$ may be either the same or different. Compounds in which the groups are the same are preferred.

$R^{1'}$ and $R^{2'}$ are preferably lower alkoxy groups, and are most preferably methoxy groups.

Examples of the lower alkyl groups represented by $R^{3'}$ and $R^{4'}$ include lower alkyl groups of 1 to 4 carbon atoms, and a methyl group or ethyl group is particularly preferred. The groups $R^{3'}$ and $R^{4'}$ may be either the same or different. Compounds in which the groups are the same are preferred.

Compounds in which $R^{3'}$ and $R^{4'}$ are hydrogen atoms yield superior effects for the present invention, and are consequently particularly desirable.

v is an integer from 0 to 2, and is preferably either 0 or 1.

As the component (C1), compounds in which v is 0 (ethylene urea-based cross-linkers) and/or compounds in which v is 1 (propylene urea-based cross-linkers) are preferred.

Compounds represented by the above general formula (C1-1) can be obtained by a condensation reaction between an alkylene urea and formalin. Furthermore, the component can also be obtained by further reacting this product with a lower alcohol of 1 to 5 carbon atoms.

Specific examples of the component (C1) include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

The component (C1) may use either a single compound or a combination of two or more different compounds.

The proportion of the component (C1) within the component (C) is preferably within a range from 20 to 100% by weight, even more preferably from 50 to 100% by weight, and most preferably from 70 to 100% by weight. Provided the proportion of the component (C1) is within this numerical range, a satisfactory cross-linking effect can be achieved.

The component (C) preferably also includes a glycoluril-based cross-linker (C2) (hereafter abbreviated as the component (C2)) as an optional component. This improves the resolution and the resist pattern shape.

The component (C2) can be selected from amongst known glycoluril-based cross-linkers used within conventional chemically amplified negative resist compositions.

Specific examples include glycoluril derivatives in which the N-position is substituted with either one of, or both, a hydroxyalkyl group of 1 to 5 carbon atoms and an alkoxyalkyl group of 1 to 4 carbon atoms. These glycoluril derivatives can be obtained by a condensation reaction between glycoluril and formalin. Furthermore, the component can also be obtained by further reacting this product with a lower alcohol of 1 to 5 carbon atoms.

Specific examples of suitable glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

The component (C2) may use either a single compound or a combination of two or more different compounds.

In those cases where the component (C2) is added, the blend ratio (the weight ratio) between the component (C1) and the component (C2) within the component (C) is preferably within a range from 99:1 to 1:99, even more preferably from 80:20 to 20:80, and is most preferably from 25:75 to 50:50.

The component (C) may also include another cross-linker (C3) (hereafter abbreviated as the component (C3)) besides the component (C1) and component (C2), provided the inclusion of this cross-linker (C3) does not impair the effects of the present invention.

There are no particular restrictions on the component (C3), which may be selected appropriately from the various cross-linkers used in conventional chemically amplified negative resist compositions.

Specific examples of suitable cross-linkers include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bisydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other suitable examples include compounds produced by reacting an amino group-containing compound such as melamine, acetoguanamine, benzoguanamine or urea (but excluding alkylene ureas such as ethylene urea and propylene urea, and glycoluril) with either formaldehyde or a combination of formaldehyde and a lower alcohol of 1 to 5 carbon atoms, thereby substituting the hydrogen atoms of the amino group with hydroxymethyl groups or lower alkoxymethyl groups of 1 to 5 carbon atoms.

Of these, compounds that use melamine are referred to as melamine-based cross-linkers, and compounds that use urea are referred to as urea-based cross-linkers.

Examples of melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol of 1 to 5 carbon atoms, thereby substituting the hydrogen atoms of the amino group with lower alkoxymethyl groups of 1 to 5 carbon atoms. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol of 1 to 5 carbon atoms, thereby substituting the hydrogen atoms of the amino group with lower alkoxymethyl groups of 1 to 5 carbon atoms. Specific examples include bismethoxymethylurea, bisethoxymethylurea, bispropoxymethylurea and bisbutoxymethylurea, and of these, bismethoxymethylurea is preferred.

The component (C3) may use either a single compound or a combination of two or more different compounds.

The blend quantity of the component (C) is preferably within a range from 3 to 20 parts by weight, even more preferably from 4 to 18 parts by weight, and most preferably from 5 to 15 parts by weight, per 100 parts by weight of the component (A). Provided the quantity of the component (C) is within this numerical range, cross-linking formation proceeds favorably, a favorable resist pattern with superior resolution can be obtained, the storage stability of the resist coating solution is favorable, and deterioration over time in the sensitivity can be suppressed.

<Optional Components>

In the negative resist composition of the present invention, in order to improve the resist pattern shape and the post exposure stability of the latent image formed by the pattern-wise exposure of the resist layer, a nitrogen-containing organic compound (D) (hereafter referred to as the component (D)) may also be added.

A multitude of these components (D) have already been proposed, and any of these known compounds can be used, although an aliphatic amine, and particularly a secondary aliphatic amine or tertiary aliphatic amine is preferred.

Examples of these aliphatic amines include amines in which at least one hydrogen atom of ammonia $NH_3$ has been substituted with an alkyl group or hydroxyalkyl group of 1 to 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, alkyl alcohol amines or trialkylamines are preferred, and alkyl alcohol amines are the most desirable. Amongst the various alkyl alcohol amines, triethanolamine and triisopropanolamine are the most preferred.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the resist composition as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives may also be added to the negative resist composition of the present invention according to need, and examples include additive resins for improving the properties of the resist film, surfactants for improving the coating properties, dissolution inhibitors, plasticizers, stabilizers, colorants, halation prevention agents, and dyes.

The negative resist composition of the present invention can be produced by dissolving the materials in an organic solvent (hereafter also referred to as the component (S)).

The organic solvent (S) may be any solvent capable of dissolving the various components used to generate a uniform solution. One or more solvents selected from known materials used as the solvents for conventional chemically amplified resists can be used.

Specific examples of the organic solvent (S) include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol and dipropylene glycol monoacetate, or the monomethyl ethers, monoethyl ethers, monopropyl ethers, monobutyl ethers or monophenyl ethers of these compounds; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (the weight ratio) in such mixed solvents can be set in accordance with factors such as the compatibility of the PGMEA and the polar solvent, the ratio is preferably within a range from 1:9 to 9:1, and is even more preferably from 2:8 to 8:2.

Examples of the polar solvent include propylene glycol monomethyl ether (PGME) and EL, and of these, PGME is particularly preferred.

More specifically, in those cases where PGME is added as the polar solvent, the weight ratio PGMEA:PGME is preferably within a range from 9:1 to 1:9, even more preferably from 8:2 to 2:8, and is most preferably from 7:3 to 4:6. In those cases where EL is added as the polar solvent, the weight ratio PGMEA:EL is preferably within a range from 1:9 to 9:1, and is even more preferably from 2:8 to 8:2.

Furthermore, as the organic solvent (S), mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent (S), although the quantity should be set in accordance with the coating film thickness required, at a concentration that enables favorable application of the solution to a substrate or the like. Typically, the quantity of solvent is set so that the solid fraction concentration of the resist composition falls within a range from 2 to 20% by weight, and preferably from 5 to 15% by weight.

<<Method of Forming Resist Pattern>>

The method of forming a resist pattern according to the present invention can be conducted, for example, in the manner described below.

Namely, the negative resist composition described above is first applied to a substrate using a spinner or the like, a prebake is then conducted under temperature conditions of 80 to 150° C., for a period of 40 to 120 seconds, and preferably for 60 to 90 seconds, and following selective exposure of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing liquid such as a 0.1 to 10% by weight aqueous solution of tetramethylammonium hydroxide. In this manner, a resist pattern that is faithful to the mask pattern can be obtained.

As the substrate, a silicon wafer or the like can be used. Inorganic substrates formed from SiON or SiN or the like can also be used. An organic or inorganic anti-reflective film may also be provided between the substrate and the applied layer of the resist composition.

There are no particular restrictions on the wavelength used for the exposure, and an ArF excimer laser, KrF excimer laser, $F_2$ excimer laser, or other radiation such as EUV (extreme ultra violet), VUV (vacuum ultra violet), EB (electron beam), X-ray or soft X-ray radiation can be used. A negative resist composition according to the present invention is particularly effective for use with an ArF excimer laser.

The negative resist composition and method of forming a resist pattern according to the present invention enable the formation of a resist pattern with favorable resolution. For example, when a line and space pattern is formed, a pattern with an improved proximity effect can be obtained in which line patterns can be resolved with a high degree of resolution right out to the edges of the pattern.

It is thought that the reasons this effect is achieved are that by using, as the component (A), a copolymer (A1) that includes a structural unit (a1) containing an aliphatic cyclic group having a fluorinated hydroxyalkyl group, and a structural unit (a2) derived from an acrylate ester that contains a hydroxyl group-containing aliphatic cyclic group, the level of alkali solubility required of a resist can be maintained while pattern swelling is suppressed, and that by using an alkylene urea-based cross-linker (C1) as the component (C), swelling of the pattern can be further suppressed.

In other words, the negative resist must dissolve in alkali within the unexposed portions of the resist.

Accordingly, the negative resist uses materials that are basically readily soluble in alkali developing liquids. For example, the component (C) uses compounds that exhibit a high degree of solubility in alkali developing liquids such as the glycoluril-based cross-linker (C2). However, it is thought that these components react with the developing liquid used during developing, thereby inviting swelling of the resist, and causing a deterioration in the resolution, and in particular, causing a worsening of the proximity effect.

In contrast, the component (A1) and component (C1) used in the present invention are resistant to swelling in alkali. In particular, investigations by the inventors of the present invention have revealed that, as shown below in test example 1, even when the blend quantity of the component (C1) is increased, the effect on the alkali solubility of the resist film is minimal. It is surmised that this observation indicates that the component (C1) suppresses swelling of the resist and contributes to an improvement in the resolution. It is thought that, as a result, a resist pattern with favorable resolution is able to be formed.

In addition, in the present invention, because the structural units (a1) and (a2) of the component (A1) contain aliphatic cyclic groups with a high carbon density, the etching resistance of the resist also improves.

EXAMPLES

As follows is a more detailed description of the present invention based on a series of examples. However, the present invention is in no way limited by the examples presented below.

In the following synthesis examples, NMR measurements were conducted using a JNM-AL400 apparatus (a product name, resolution: 400 MHz) manufactured by JEOL Ltd.).

Furthermore, the monomers used in the following synthesis examples are shown below.

NBHFAA: a monomer (norbornene hexafluoroalcohol acrylate) represented by a chemical formula shown below:

[Formula 23]

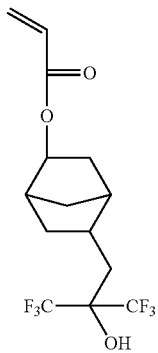

HEMA: a monomer (hydroxyethyl methacrylate) represented by a chemical formula shown below:

[Formula 24]

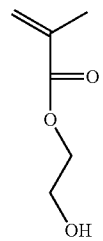

AdOHA: a monomer (1-(3-hydroxyadamantyl)acrylate) represented by a chemical formula shown below:

[Formula 25]

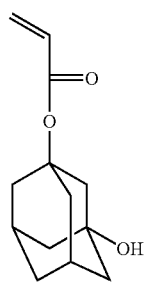

Synthesis Example 1

13.58 g of NBHFAA, 1.76 g of HEMA, 6.0 g of AdOHA, and 0.6 g of the polymerization initiator dimethyl azobisisobutyrate were dissolved in 200 ml of THF (tetrahydrofuran). Nitrogen was bubbled through the solution for approximately 10 minutes, and the solution was then stirred under heating for 4 hours using a 70° C. oil bath, and then cooled to room temperature. Subsequently, the reaction solution was concentrated using an evaporator, the concentrated liquid was dissolved in 120 ml of THF, the resulting solution was poured into 1,000 ml of heptane to precipitate the resin, and the precipitated resin was then filtered. The thus obtained resin was dried in a dryer at 40° C. for 24 hours, yielding 18.8 g of a white solid. This product is termed resin (A)-1.

The chemical formula of the obtained resin (A)-1 is indicated by the chemical formula below. The weight average molecular weight (Mw) was 5,000, and the degree of dispersion (Mw/Mn) (wherein Mn is the number average molecular weight) was 1.67.

Furthermore, analysis by carbon NMR revealed that the compositional ratio (mol %) between the structural units derived from each of the monomers (NBHFAA/HEMA/AdOHA), represented by the ratio p/q/r in the chemical formula shown below, was p/q/r=50/17/33.

[Formula 26]

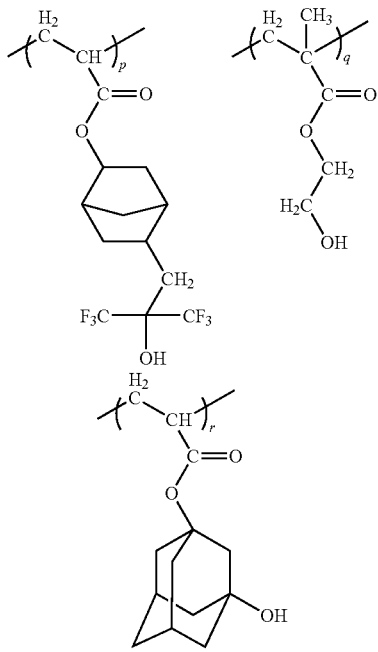

Synthesis Example 2

A resin (A)-2 was obtained in the same manner as the synthesis example 1.

The chemical formula for the obtained resin (A)-2 was the same as that for the resin (A)-1. The Mw value was 4,500, and the value of Mw/Mn was 1.69.

Furthermore, analysis by carbon NMR revealed that the compositional ratio (mol %) between the structural units derived from each of the monomers (NBHFAA/HEMA/AdOHA), represented by the ratio p/q/r in the above chemical formula, was p/q/r=50/17/33.

Example 1

The components shown below in Table 1 were mixed together and dissolved, yielding a series of negative resist compositions.

Each of the thus obtained negative resist compositions was evaluated in the manner described below.

First, an organic anti-reflective film composition AR-46 (a product name, manufactured by Rohm and Haas Company) was applied to the surface of a silicon wafer using a spinner, and the composition was then baked and dried on a hotplate at 215° C. for 60 seconds, thereby forming an organic anti-reflective film with a film thickness of 30 nm.

The negative resist composition prepared above was then applied to the surface of this organic anti-reflective film using a spinner, and was then subjected to a post applied bake (PAB) on a hotplate at 80° C. for 60 seconds, thereby forming a resist film with a film thickness of 140 nm.

The resist film was then selectively irradiated with an ArF excimer laser (193 nm) through a (half tone) mask pattern, using an ArF exposure apparatus NSR-S302 (manufactured by Nikon Corporation, NA (numerical aperture)=0.60, ⅔ annular illumination).

A post exposure baking (PEB) treatment was then conducted at 100° C. for 60 seconds, and the resist film was subjected to development for 60 seconds at 23° C. in a 2.38% by weight aqueous solution of tetramethylammonium hydroxide (TMAH), and was then rinsed for 20 seconds with water and dried, completing formation of a resist pattern.

Using the optimal exposure (sensitivity; Fop) for formation of a line and space pattern (L/S pattern) with a line width of 120 nm and a pitch of 240 nm, the size of the mask pattern was varied, and the smallest pattern dimensions for which the resist pattern could be resolved right out to both edges of the pattern (namely, the resolution) was determined. The results are shown in Table 1.

TABLE 1

|  | Component (A) | Component (B) | Component (C) |  | Component (D) | Component (S) | Resolution |
|---|---|---|---|---|---|---|---|
| Example 1 | (A)-1 | (B)-1 | (C)-1 | — | (D)-1 | (S)-1 | 120 nm |
|  | [100] | [1.5] | [5.0] |  | [0.3] | [1150] |  |
| Example 2 | (A)-1 | (B)-1 | (C)-1 | — | (D)-1 | (S)-1 | 120 nm |
|  | [100] | [1.5] | [7.5] |  | [0.3] | [1150] |  |
| Example 3 | (A)-1 | (B)-1 | (C)-1 | (C)-2 | (D)-1 | (S)-1 | 120 nm |
|  | [100] | [1.5] | [2.5] | [5.0] | [0.3] | [1150] |  |

TABLE 1-continued

| | Component (A) | Component (B) | Component (C) | | Component (D) | Component (S) | Resolution |
|---|---|---|---|---|---|---|---|
| Example 4 | (A)-2 [100] | (B)-1 [1.5] | (C)-1 [5.0] | — | (D)-1 [0.3] | (S)-1 [1150] | 120 nm |
| Example 5 | (A)-2 [100] | (B)-1 [1.5] | (C)-1 [7.5] | — | (D)-1 [0.3] | (S)-1 [1150] | 120 nm |
| Example 6 | (A)-2 [100] | (B)-1 [1.5] | (C)-1 [10] | — | (D)-1 [0.3] | (S)-1 [1150] | 120 nm |
| Example 7 | (A)-2 [100] | (B)-1 [1.5] | (C)-1 [15] | — | (D)-1 [0.3] | (S)-1 [1150] | 120 nm |
| Comparative example 1 | (A)-1 [100] | (B)-1 [1.5] | — | (C)-2 [3.0] | (D)-1 [0.3] | (S)-1 [1150] | 140 nm |
| Comparative example 2 | (A)-1 [100] | (B)-1 [1.5] | — | (C)-2 [5.0] | (D)-1 [0.3] | (S)-1 [1150] | 130 nm |
| Comparative example 3 | (A)-1 [100] | (B)-1 [1.5] | — | (C)-2 [7.5] | (D)-1 [0.3] | (S)-1 [1150] | 140 nm |
| Comparative example 4 | (A)-1 [100] | (B)-1 [1.5] | — | (C)-2 [10] | (D)-1 [0.3] | (S)-1 [1150] | 140 nm |
| Comparative example 5 | (A)-1 [100] | (B)-1 [1.5] | — | (C)-3 [5] | (D)-1 [0.3] | (S)-1 [1150] | 140 nm |
| Comparative example 6 | (A)-1 [100] | (B)-1 [1.5] | — | (C)-3 [10] | (D)-1 [0.3] | (S)-1 [1150] | — |
| Comparative example 7 | (A)-1 [100] | (B)-1 [1.5] | — | (C)-3 [15] | (D)-1 [0.3] | (S)-1 [1150] | — |
| Comparative example 8 | (A)-1 [100] | (B)-1 [1.5] | — | (C)-3 [20] | (D)-1 [0.3] | (S)-1 [1150] | — |
| Comparative example 9 | (A)-1 [100] | (B)-1 [1.5] | — | (C)-4 [5] | (D)-1 [0.3] | (S)-1 [1150] | 140 nm |
| Comparative example 10 | (A)-1 [100] | (B)-1 [1.5] | — | (C)-4 [10] | (D)-1 [0.3] | (S)-1 [1150] | — |
| Comparative example 11 | (A)-1 [100] | (B)-1 [1.5] | — | (C)-4 [15] | (D)-1 [0.3] | (S)-1 [1150] | — |
| Comparative example 12 | (A)-1 [100] | (B)-1 [1.5] | — | (C)-4 [20] | (D)-1 [0.3] | (S)-1 [1150] | — |
| Comparative example 13 | (A)-1 [100] | (B)-1 [1.5] | — | (C)-5 [5] | (D)-1 [0.3] | (S)-1 [1150] | 140 nm |
| Comparative example 14 | (A)-1 [100] | (B)-1 [1.5] | — | (C)-5 [10] | (D)-1 [0.3] | (S)-1 [1150] | 140 nm |
| Comparative example 15 | (A)-1 [100] | (B)-1 [1.5] | — | (C)-5 [15] | (D)-1 [0.3] | (S)-1 [1150] | — |
| Comparative example 16 | (A)-1 [100] | (B)-1 [1.5] | — | (C)-5 [20] | (D)-1 [0.3] | (S)-1 [1150] | — |

The meanings of the abbreviations used in Table 1 are as shown below.

(B)-1: triphenylsulfonium trifluoromethanesulfonate (C)-1: a cross-linker represented by a chemical formula shown below (product name: N-1951, manufactured by Sanwa Chemical Co., Ltd.)

(C)-2: a cross-tinker represented by a chemical formula shown below (product name: MX-270, manufactured by Sanwa Chemical Co., Ltd.)

(C)-3: a cross-linker represented by a chemical formula shown below (product name: MX-280, manufactured by Sanwa Chemical Co., Ltd.)

(C)-4: a cross-linker represented by a chemical formula shown below (product name: E-9002, manufactured by Sanwa Chemical Co., Ltd.)

(C)-5: a cross-linker represented by a chemical formula shown below (product name: N-8314, manufactured by Sanwa Chemical Co., Ltd.)

(D)-1: triisopropanolamine (S)-1: propylene glycol monomethyl ether

[Formula 27]

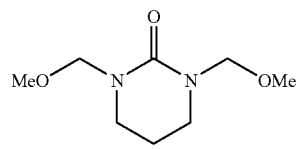

(C)-1

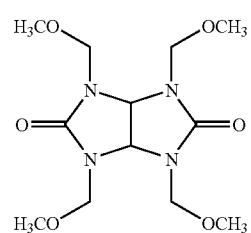

(C)-2

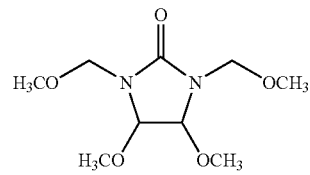

(C)-3

-continued

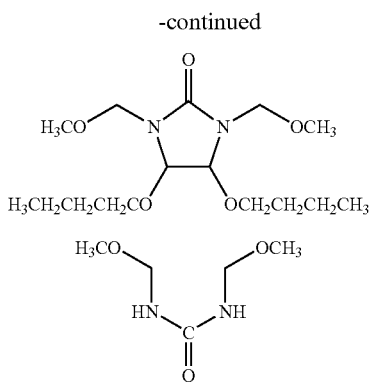

(C)-4

(C)-5

As is evident from the above results, the negative resist compositions of the examples 1 to 7 that used the methylene urea-based cross-linker (C)-1 exhibited favorable improvement in the proximity effect, with the line pattern in the central portion, which was different from the line patterns at both sides, and the line patterns at the resist edges both able to be resolved in a similar favorable manner, enabling the formation of a resist pattern with excellent resolution.

Furthermore, when the shapes of the formed resist patterns were inspected it was found that the larger the blend quantity of (C)-1, the more favorable the rectangularity of the pattern became. For example, amongst the examples 4 to 7, in which the blend quantity of (C)-1 was varied within a range from 5.0 to 15 parts by weight, the shapes of the examples 6 and 7, which contained 10 parts by weight and 15 parts by weight respectively of (C)-1, were extremely good.

In contrast, in the comparative examples 1 to 16 that did not use the specified alkylene urea-based cross-linker, the line patterns at the edges of the resist were difficult to resolve, and the resolution was poor.

Furthermore, when the shapes of the formed resist patterns were inspected, it was found that the larger the blend quantity of (C)-2, the worse the resist swelling became, and the thicker the line patterns became. Furthermore, the cross-sectional shape of the line patterns exhibited footing, which describes a shape in which the bases of the lines tend to spread out.

Furthermore, in the case of the compounds (C)-3 to (C)-5, formation of a resist pattern became impossible when the blend quantity was increased.

Test Example 1

Using the procedure described below, the effect of the component (C) on the dissolution rate of the resist film was evaluated.

With the exception of altering the blend quantity of (C)-1 to 5.0 parts by weight, 10 parts by weight, 15 parts by weight and 20 parts by weight respectively as the component (C), negative resist compositions were prepared in the same manner as the example 1.

Furthermore, with the exception of altering the blend quantity of (C)-2 to 5.0 parts by weight and 10 parts by weight respectively as the component (C), negative resist compositions were also prepared in the same manner as the comparative example 1.

Subsequently, an organic anti-reflective film composition AR-46 (a product name, manufactured by Brewer Science Ltd.) was applied to the surface of a silicon wafer using a spinner, and the composition was then baked and dried on a hotplate at 215° C. for 60 seconds, thereby forming an organic anti-reflective film with a film thickness of 30 nm. Each of the negative resist compositions prepared above was applied to the surface of this type of organic anti-reflective film using a spinner, and was then subjected to a post applied bake (PAB) on a hotplate at 80° C. for 60 seconds, thereby forming a resist film with a film thickness of 140 nm.

The resist film was then immersed in a 2.38% by weight aqueous solution of TMAH (tetramethylammonium hydroxide) (at approximately 23° C.), and the dissolution rate (nm/second) was determined by measuring the time taken for the film thickness to reduce to zero.

From these results, a graph was prepared with the blend quantity (parts by weight) of the component (C) along the horizontal axis and the dissolution rate (nm/second) along the vertical axis. This graph is shown in FIG. 1.

As shown in FIG. 1, when (C)-2 was used as the component (C), doubling the blend quantity of (C)-2 from 5 parts by weight to 10 parts by weight resulted in an approximate doubling of the solubility rate from 15.5 nm/second to 32.3 nm/second. In contrast, when (C)-1 was used as the component (C), there was almost no change in the solubility rate of the resist film.

INDUSTRIAL APPLICABILITY

According to a negative resist composition of the present invention, and a method of forming a resist pattern including a step that uses such a composition, favorable resolution is achieved right out to the edge portions of the resist pattern. As a result, a resist pattern of excellent resolution can be formed.

The invention claimed is:

1. A negative resist composition, comprising an alkali-soluble resin component (A), an acid generator component (B) that generates acid upon exposure, and a cross-linker component (C), wherein
said alkali-soluble resin component (A) is a copolymer (A1) that comprises a structural unit (a1) containing an aliphatic cyclic group having a fluorinated hydroxyalkyl group, and a structural unit (a2) derived from an acrylate ester that contains a hydroxyl group-containing aliphatic cyclic group, and
said cross-linker component (C) is an alkylene urea-based cross-linker (C1) represented by a general formula (C1-1) shown below:

[Formula 1]

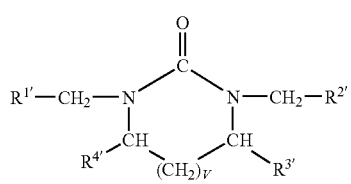

(C1-1)

[wherein, $R^{1'}$ and $R^{2'}$ each represent, independently, a hydroxyl group or a lower alkoxy group; $R^{3'}$ and $R^{4'}$ each represent, independently, a hydrogen atom, a hydroxyl group, or a lower alkyl group; and v represents an integer from 0 to 2].

2. A negative resist composition according to claim 1, wherein said cross-linker component (C) further comprises a glycoluril-based cross-linker (C2).

3. A negative resist composition according to claim 1, wherein a blend quantity of said cross-linker component (C) is within a range from 3 to 20 parts by weight per 100 parts by weight of said alkali-soluble resin component (A).

4. A negative resist composition according to claim 1, wherein said copolymer (A1) further comprises a structural unit (a3) derived from acrylic acid that contains no cyclic structures and contains an alcoholic hydroxyl group as a side chain.

5. A negative resist composition according to claim 1, further comprising a nitrogen-containing organic compound (D).

6. A method of forming a resist pattern, comprising the steps of: forming a resist film on a substrate using a negative resist composition according to any one of claim 1 through claim 5, exposing said resist film, and developing said resist film to form a resist pattern.

\* \* \* \* \*